(12) United States Patent
Van Mau et al.

(10) Patent No.: US 7,627,458 B1
(45) Date of Patent: Dec. 1, 2009

(54) RESOURCE AND CONTEXT BASED MULTIPLIER GENERATION

(75) Inventors: David Nguyen Van Mau, Grenoble (FR); Yassine Rjimati, Grenoble (FR)

(73) Assignee: XILINX, Inc., San Jose, CA (US)

( * ) Notice: Subject to any disclaimer, the term of this patent is extended or adjusted under 35 U.S.C. 154(b) by 769 days.

(21) Appl. No.: 11/314,767

(22) Filed: Dec. 21, 2005

(51) Int. Cl.
*G06F 17/50* (2006.01)
*G06F 3/00* (2006.01)

(52) U.S. Cl. .............................. 703/2; 703/26; 703/27; 712/37; 712/223; 716/2

(58) Field of Classification Search ............. 703/2, 703/26, 27; 712/37, 223; 716/2, 5
See application file for complete search history.

(56) References Cited

U.S. PATENT DOCUMENTS

| | | | |
|---|---|---|---|
| 7,035,332 B2 * | 4/2006 | He et al. | 375/240.02 |
| 7,114,055 B1 * | 9/2006 | Baxter | 712/37 |
| 7,372,297 B1 * | 5/2008 | Pugh et al. | 326/38 |
| 2002/0129080 A1 * | 9/2002 | Hentschel et al. | 709/102 |

OTHER PUBLICATIONS

Charles R. Baugh et al.; "A Two's Complement Parallel Array Multiplication Algorithm"; IEEE Transactions on Computers, vol. C-22, No. 12; Dec. 1973; pp. 1045-1047.

P.E. Blankenship; Comments on "A Two's Complement Parallel Array Multiplication Algorithm"; IEEE Transactions on Computers; Dec. 1974; pp. 1327.

David Kroft; Comments on "A Two's Complement Parallel Array Multiplication Algorithm"; IEEE Transactions on Computers; Dec. 1974; pp. 1327-1328.

* cited by examiner

*Primary Examiner*—Thai Phan
(74) *Attorney, Agent, or Firm*—Thomas A. Ward; Thomas George

(57) ABSTRACT

A method is provided to automatically allocate resources of an integrated circuit (IC) to form multipliers in a given design to optimize the use of IC resources. Information about the multipliers in the design is extracted to place the multipliers into a priority order. The priority allows primitives in the IC, like DSP blocks LUTs or MUXCYs to be economically allocated to the multipliers. The ordering criteria can include: (1) a user defined criteria, (2) the number of primitives required to implement a multiplier, or (3) a size of the multiplier operands. This invention further optimally allocates LUTs and MUXCYs when DSP48 blocks are exhausted. The steps for generating a multiplier include: constructing a partial product matrix and minimizing the adders used in the multiplier by minimizing the size of support for the partial products. Either LUTs or MUXCYs are selected depending on the size of support determined.

19 Claims, 5 Drawing Sheets

|  | Mult1 | Mult2 | Mult3 | Mult4 | Mult5 |
|---|---|---|---|---|---|
| Number of DSP48s | 4 | 3 | 1 | 1 | 1 |
| Priority | 1 | 2 | 3 | 3 | 3 |

FIG. 2

|  | Mult1 | Mult2 | Mult3 | Mult4 | Mult5 |
|---|---|---|---|---|---|
| Initial DSP48 allocation | 4 | 3 | 1 | 0 | 0 |

FIG. 3

|  | Mult1 | Mult2 | Mult4 | Mult3 | Mult5 |
|---|---|---|---|---|---|
| Further DSP48 allocation | 4 | 3 | 0 | 0 | 1 |

FIG. 4

|  |  |  | A3 | 0 | A1 | A0 |
|---|---|---|---|---|---|---|
| x |  |  | B3 | B2 | B1 | B0 |
|  |  |  | P03 | 0 | P01 | P00 |
|  |  | P13 | 0 | P11 | P10 | 0 |
|  | P23 | 0 | P21 | P20 | 0 | 0 |
| P33 | 0 | P31 | P30 | 0 | 0 | 0 |

FIG. 5

|  |  |  | 0 | 0 | 0 | 0 |
|---|---|---|---|---|---|---|
|  |  | 0 | P03 | 0 | 0 | 0 |
|  | 0 | P13 | P21 | P11 | P01 | 0 |
| P33 | P23 | P31 | P30 | P20 | P10 | P00 |

FIG. 6

|       |    |    |    |    |    |    |    | Support              | Size of support |
|-------|----|----|----|----|----|----|----|----------------------|-----------------|
| Line1 | 0  | 0  | P0 | P1 | P0 | 0  | 0  | {P0, P1}             | 2               |
| Line2 | 0  | P2 | P1 | P3 | P1 | P3 | P4 | {P1, P2, P3, P4}     | 4               |
| Line3 | P5 | P6 | P4 | P0 | P5 | P7 | P2 | {P0, P2, P4, P5, P6, P7} | 6           |

FIG. 7

| 0  | 0  | P0 | P1 | P0 | 0  | 0  |
|----|----|----|----|----|----|----|
| 0  | P2 | P1 | P3 | P1 | P3 | P4 |
| P5 | P6 | P4 | P0 | P5 | P7 | P2 |

FIG. 8

|       |    |    |    |    |    |    |    | Support         | Size of support |
|-------|----|----|----|----|----|----|----|-----------------|-----------------|
| Line1 | 0  | 0  | P1 | P1 | P1 | 0  | 0  | {P1}            | 1               |
| Line2 | 0  | P2 | P0 | P0 | P0 | P7 | P2 | {P0, P2, P7}    | 3               |
| Line3 | P5 | P6 | P4 | P3 | P5 | P3 | P4 | {P3, P4, P5, P6} | 4              |

FIG. 9

| Line1 | 0 | 0 | P1 | 0 | 0 | 0 | P2 |
| --- | --- | --- | --- | --- | --- | --- | --- |
| Line2 | P3 | 0 | P4 | 0 | P5 | 0 | 0 |
| Line3 | 0 | 0 | 0 | P6 | P7 | P8 | P9 |
| Line4 | P10 | 0 | P11 | P12 | P13 | P14 | P15 |

FIG. 10

RESOURCE AND CONTEXT BASED MULTIPLIER GENERATION

BACKGROUND

1. Technical Field

Embodiments of the present invention relate to allocating resources of a field programmable gate array (FPGA) to implement functions that include multiplication operations.

2. Related Art

An FPGA is an integrated circuit chip that includes components such as programmable input/output buffers (IOBs), configurable logic blocks (CLBs), block random access memory (BRAMs), and a programmable interconnect circuitry for interconnecting the IOBs, CLBs and BRAMs. The FPGAs further include static random access memory (SRAM) configuration memory cells that can be programmed to configure the logic in the IOBs, CLBs and BRAMs. The SRAM configuration memory cells are typically programmed at startup of the FPGA, but can be reprogrammed using a partial reconfiguration process during operation of the FPGA by programming frames or a number of columns of the SRAM memory cells at a time.

The CLBs include a number of look up tables (LUTs) typically made up of components such as multiplexers and SRAM memory cells. At configuration, a bitstream is provided to program the individual SRAM memory cells to set the state of each LUT with a desired function by writing the truth table of the desired function to the individual SRAM memory cells. Each LUT implements a logic function with n inputs that select an output depending on how the SRAM memory cells are programmed or configured. Logic functions may use all n inputs to the logic element or may use only a subset thereof. A few of the possible logic functions that an LUT can implement are: AND, OR, and XOR gates. LUTs can be programmed to perform other functions such as an adder or multiplier.

Some FPGAs include dedicated components that provide programmable features in addition to the LUTs. For example, a digital signal processor (DSP) can be provided on board the FPGA when typical users are expected to build a number of DSPs using the LUTs. Dedicated DSPs will use less logic and chip space than programming a number of LUTs to form the DSP. DSPs can form large multipliers more efficiently than comparable LUTs. Similarly, multipliers can be formed using a multiplexer/carry (MUXCY) dedicated circuit(s) in the FPGA which may enable large multiplication operations to be formed with less resources than using a number of LUTs to create the same large multiplier. Although DSPs and multiplexer/carry devices are described, other components can likewise be included on the FPGA, such as a microprocessor, that can be configured and interconnected using the programmable logic features in the FPGA.

Macros for implementing multipliers in hardware are provided using a register transfer level (RTL) multiply operation, where RTL is a high-level hardware description language (HDL) for defining digital circuits. Multipliers are one of the most critical macros especially for DSP designs as their implementation on FPGA resources can significantly impact both the size and the performances of the final design. From a behavioral side, multipliers can take multiple configurations, from multipliers with one constant input to full multipliers where both operands are variable and different. The size of the operands is another of the main differentiating characteristics between multipliers.

Multipliers can be implemented on FPGAs using LUTs, MUXCYs, or other specific resources providing a multiplier primitive. An array of LUTs and MUXCYs are provided in the Virtex2 or Virtex4 FPGAs manufactured by Xilinx Corporation of San Jose, Calif. The Virtex2 and Virtex4 FPGAs include other primitives such as the Virtex4 DSP48 or the Virtex2 MULTI 18×18.

One approach available in the prior art to implement multipliers using LUTs or MUXCYs or other dedicated multiplier resources is to perform resource allocation to implement the multipliers randomly. Multipliers are first generated by creating adder trees to perform the sum of partial product terms. Dedicated resources, such as LUTs, are then used to provide the adder tree stages to create the multiplier.

It would be desirable to provide a method for optimizing resource allocation by minimizing the number of dedicated multiplier resources required for a design. In particular, what is needed is a method of resource allocation for multipliers that takes into consideration factors such as: the number of primitives required to implement the multiplier, a user choice for multiplier components, or the size of the multiplier operands.

SUMMARY

Embodiments of the present invention provide a process for determining resources for implementing multipliers in a given design using resource primitives of a PLD such as DSPs, LUTs or MUXCYs. Resources are allocated to provide the best implementation for the multipliers within a given design according to device and performance constraints.

For embodiments of the present invention, information about the multipliers in the design is extracted and sorted to place the multipliers in decreasing priority order. The priority is set so that available multiplier primitives, such as DSPs, LUTs and MUXCYs can be economically and optimally allocated to the multipliers. The ordering criteria can include, but are not limited to, one or more of the following: (1) a user entered criteria, (2) the number of multiplier primitives required to implement each multiplier, or (3) the size of the multiplier operands.

Embodiments of the present invention also provide a substantially optimal implementation for allocating LUTs and MUXCYs when DSP resources are exhausted. The steps for generating the multipliers include: constructing a partial product matrix and minimizing the number of adders used in the multiplier by minimizing the size of support required for the partial products. Finally, either LUTs or MUXCYs are selected depending on the size of supports determined.

BRIEF DESCRIPTION OF THE DRAWINGS

Further details of embodiments of the present invention are explained with the help of the attached drawings in which:

FIG. 2 shows the five example multipliers of FIG. 1 ranked by the number of DSP48 blocks each multiplier requires;

FIG. 3 shows the initial allocation of DSP48 blocks to the example multipliers of FIG. 1;

FIG. 4 shows a subsequent allocation of DSP48 blocks after revisiting the initial allocation of the blocks in FIG. 3;

FIG. 5 shows a first example initial partial product matrix;

FIG. 6 shows another partial product matrix resulting from manipulating the matrix of FIG. 5 to reduce the number of adders required to obtain a final product for the example two operands, A and B, of FIG. 5;

FIG. 7 shows a second example initial partial product matrix, as well as the support and size of support for each line, or row, of the matrix;

FIG. 8 shows a partial product matrix resulting from shifting partial products in the columns of the partial product matrix of FIG. 7 in order to minimize the number of adders required to implement the multiplier;

FIG. 9 shows the resulting partial product matrix after the transpositions shown in FIG. 8 are performed, as well as the resulting supports and size of supports; and FIG. 10 shows a third example partial product matrix, from which an adder tree will be constructed.

DETAILED DESCRIPTION

I. Example Function with Multipliers

Figure 1:
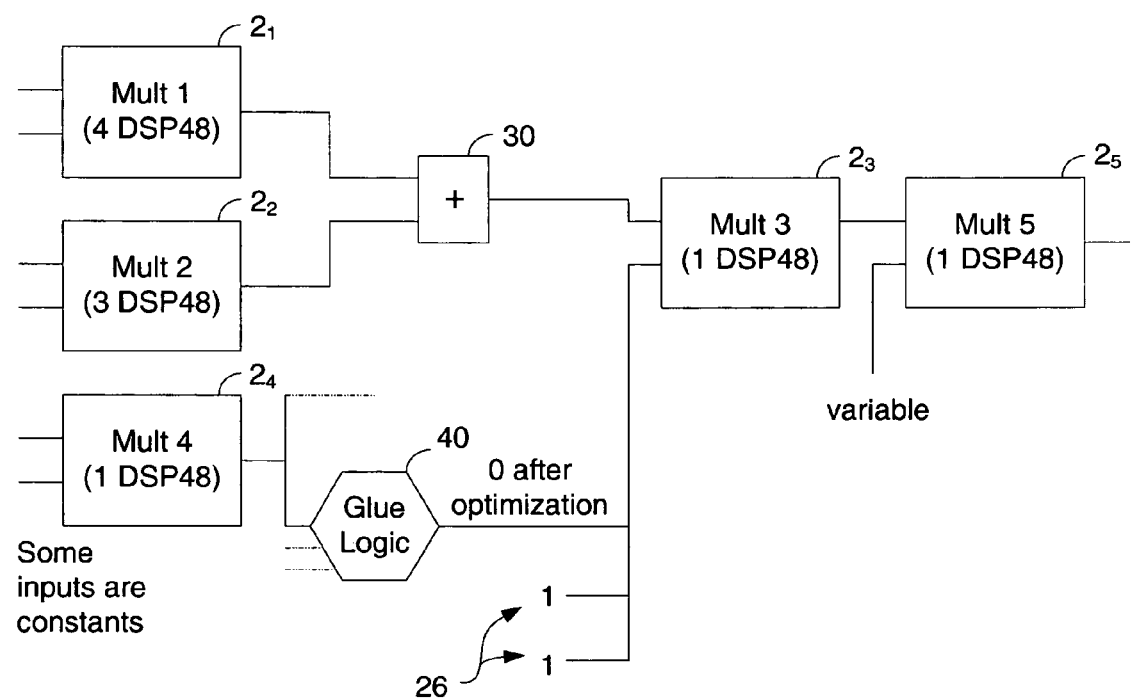
FIG. 1 illustrates a mathematical function design example for which primitives are to be allocated.

FIG. 1 shows an example of a mathematical function with multipliers to be implemented as a design in an FPGA according to embodiments of the present invention. FIG. 1 includes five multipliers, Mult1 $2_1$, Mult2 $2_2$, Mult3 $2_3$, Mult4 $2_4$ and Mult5 $2_5$, with each multiplier having two inputs. The inputs of Mult1 $2_1$ and Mult2 $2_2$ are unknown variables. One or both inputs of Mult4 $2_4$ are constants. The resulting outputs of Mult1 $2_1$ and Mult2 $2_2$ are added together using adder 30. The resulting output of Mult4 $2_4$ is input into glue logic 40, which will provide an output of zero after optimization. Since the output of glue logic 40 is zero, and bits 26 are constants, one input to Mult3 $2_3$ will be a constant to be multiplied with the output of adder 30. The input of Mult5 $2_5$ is the output of Mult3 $2_3$ along with another variable signal.

Allocation of DSP Resources

To allocate resources, it is initially assumed resources are provided from a Virtex4 FPGA where the multiplier primitives include DSP48 blocks as well as LUTs and MUXCYs. Information about the multipliers in the design is extracted and sorted through processes described below to place the multipliers in decreasing priority order, such that available multiplier primitives can be economically allocated to the multipliers. The ordering criteria can be one or more of the following: (1) user implementation choice, (2) the number of primitives required to implement the multiplier, and (3) the size of the multiplier operands.

Initially multipliers can be ranked by the number of DSP48 blocks required for each multiplier. Although DSP48 blocks are chosen, the size of multiplier operands, or the amount of LUTs required to create the multiplier might likewise be used. FIG. 2 shows the five example multipliers $2_{1-5}$ of FIG. 1 ranked by the number of DSP48 blocks each multiplier requires. As shown in FIG. 1, Mult1 $2_1$ requires four DSP48 blocks and requires the highest number of primitives of all the multipliers $2_{1-5}$. Thus, in FIG. 2, Mult1 $2_1$ requires four DSP48 blocks and has first priority, or a rank of one. Mult2 $2_2$ requires three DSP48 blocks and requires the second highest number of primitives of all the multipliers $2_{1-5}$ and has second priority, or a rank of two. Mult3 $2_3$, Mult4 $2_4$ and Mult5 $2_5$, each require one DSP48 block and each has third priority, or a rank of three.

Next, to start an allocation of resources, DSP48 blocks are preallocated. FIG. 3 shows the initial allocation of DSP48 blocks to the example multipliers of FIG. 1. As a non-limiting example, assume that only eight DSP48 blocks are available to use in the design. The DSP48 blocks are allocated to the multipliers according to priority order of the multipliers in FIG. 2, as long as the blocks are available. Mult1 has the highest priority of the multipliers in FIG. 2 and requires four DSP48 blocks. Because eight DSP48 blocks available. Mult1 is initially allocated four DSP48 blocks in FIG. 3. Four of the eight DSP48 blocks now remain available. Mult2 has the second highest priority of the multipliers in FIG. 2 and requires three DSP48 blocks. Because four DSP48 blocks remain available, Mult2 is initially allocated three DSP48 blocks in FIG. 3. One of the eight DSP48 blocks now remains available. The remaining multipliers, Mult3, Mult4 and Mult5 have the same priority in FIG. 2. The remaining available DSP48 block can be initially allocated to any of the three multipliers. As a non-limiting example, assume Mult3 is initially allocated the remaining available DSP48 block in FIG. 3. Because DSP48 blocks are no longer available for Mult4 and Mult5, these multipliers are initially allocated zero DSP48 blocks in FIG. 3.

FIG. 4 shows a subsequent allocation of DSP48 blocks after revisiting the initial allocation of the blocks in FIG. 3. For the subsequent allocation of DSPs in FIG. 4, only eight blocks are assumed available for use in the design. Also if one or both of a multiplier's operands is constant, it is assumed an efficient implementation for the multiplier is the use of LUTs. If a multiplier was pre-allocated DSP48 blocks in FIG. 3, by substituting LUTs the multiplier's pre-allocated DSP48 blocks are freed up to be allocated to one or more other multipliers in FIG. 4.

The overall allocation of components for multipliers are computed in a topological order from the inputs to the outputs of the design. Following the topological order of inputs shown in FIG. 1, the first inputs of the design are analyzed for any constants. Mult1 $2_1$, Mult2 $2_2$ and Mult4 $2_4$ provide the first inputs of the design. Mult1 $2_1$ and Mult2 $2_2$ both have inputs that are variables and can thus be efficiently implemented using DSP48 blocks. As Mult1 and Mult2 were initially allocated DSP48 blocks in FIG. 3, the allocation of DSP48 blocks to these multipliers remains four and three, respectively, in FIG. 4. Only Mult4 $2_4$ has one or both inputs that are constants, as shown in FIG. 1, and can thus be efficiently implemented using LUTs. Since Mult4 was not preallocated DSP48 blocks in FIG. 3, however, the subsequent allocation of DSP48 blocks to Mult4 remains zero in FIG. 4.

Continuing to follow the topological order of inputs shown in FIG. 1, Mult1 $2_1$, Mult2 $2_2$, Mult4 $2_4$ are computed and can provide a constant to multiplier Mult3 $2_3$. Note the output of Mult4 $2_4$ is shown provided through glue logic 40 of FIG. 1 and becomes zero after optimization. The initial allocation of one DSP48 block to Mult3 is, thus, revisited. Because Mult3 can efficiently be implemented using LUTs, this computation frees one DSP48 block for use by any remaining multipliers, and the final allocation of DSP48 blocks for Mult3 in zero in FIG. 4. Because Mult5 was initially pre-allocated zero DSP48 blocks, and one DSP is now freed up, the number of DSP48 blocks for Mult5 is reallocated to be one in FIG. 4.

As another non-limiting example, take a multiplier requiring three DSP48 blocks but only one DSP48 block remains available. Assume also that none of the multiplier's inputs are constants, making the multiplier a good candidate for DSP48 block allocation. The multiplier can be allocated the one remaining DSP48, and LUTs can be allocated in place of the other two DSP48 blocks the multiplier originally required.

As another non-limiting example, assume three DSP48s remain, and one multiplier remains that requires three DSP48s, while another requires four. Although the multiplier requiring four DSP48s would be assigned a higher priority, final allocation of available resources is made so that a single multiplier can be made up completely of DSP48s. Accordingly, the multiplier requiring the three DSP48s would be allocated the three DSP48s, while the remaining multiplier requiring four DSP48s would be allocated LUTs or FPGA resources to create the multipliers.

Multiplier Generation Using Look Up Tables and MUXCYs

Once major resources, such as DSP48s are allocated, more limited resources such as LUTs and MUXCYs can be allocated to provide multipliers. The steps for generating a multiplier using LUTs involves four steps. The first two steps include constructing a partial product matrix and minimizing the number of adders used in the multiplier. The last two steps include minimizing the size of support for the partial products and constructing an adder tree. These steps assume either signed or unsigned multipliers.

1. Construction of Partial Product Matrix

FIG. 5 shows a first example initial partial product matrix. The partial product matrix is shown in rows three through six. Let A and B be the two inputs of a multiplier. Let A be a four digit operand, where A=(A3, 0, A1, A0), as shown in the top row of FIG. 5. Let B be a four digit operand, B=(B3, B2, B1, B0), as shown in the second row of FIG. 5. The entry in the first column, second row of FIG. 5 shows a multiplication sign. The remaining four rows of FIG. 5 show the partial products when A and B are multiplied.

The first partial product is obtained by multiplying the four digits of operand A by B0, the last digit of operand B. Thus, A0 multiplied by B0 equals product P00, A1 multiplied by B0 equals P01, 0 multiplied by B0 equals 0, and A3 multiplied by B0 equals P03. These products, P03, 0, P01 and P00, are listed on the third row of the partial product matrix in the rightmost fields, columns 4, 5, 6 and 7, respectively.

The second partial product is obtained by multiplying the four digits of operand A by B1, the third digit of operand B. First a zero is placed in the rightmost column of row four of the partial product matrix. Thus, A0 multiplied by B1 equals product P10, A1 multiplied by B1 equals P11, 0 multiplied by B1 equals 0, and A3 multiplied by B1 equals P13. These products, P13, 0, P11 and P10, are listed on the fourth row of the partial product matrix in columns 3, 4, 5 and 6, respectively.

The third partial product is obtained by multiplying the four digits of operand A by B2, the second digit of operand B. First a zero is placed in the two rightmost columns of row five of the partial product matrix. Thus, A0 multiplied by B2 equals product P20, A1 multiplied by B2 equals P21, 0 multiplied by B2 equals 0, and A3 multiplied by B2 equals P23. These products, P23, 0, P21 and P20, are listed on the fifth row of the partial product matrix in columns 2, 3, 4 and 5, respectively.

The fourth and last partial product is obtained by multiplying the four digits of operand A by B3, the first digit of operand B. First a zero is placed in the three rightmost columns of row six of the partial product matrix. Thus, A0 multiplied by B3 equals product P30, A1 multiplied by B3 equals P31, 0 multiplied by B3 equals 0, and A3 multiplied by B3 equals P33. These products, P33, 0, P31 and P30, are listed on the sixth row of the partial product matrix in columns 1, 2, 3 and 4, respectively. The partial product matrix shown in FIG. 5 is now complete.

I. Minimization of Number of Required Adders in the Multiplier

FIG. 6 shows another partial product matrix resulting from manipulating the matrix of FIG. 5 to reduce the number of adders required to obtain a final product for the example two operands, A and B. To obtain the final product for A and B, the entries of each column will be added together. The partial product matrix of FIG. 5 would require three adders to obtain the final product. To add the four rows of numbers together in FIG. 5, three additions must be made: (P03, 0, P01, P00)+(P13, 0, P11, P10, 0)+(P23, 0, P21, P20, 0, 0)+(P33, 0, P31, P30, 0, 0, 0).

The partial product matrix of FIG. 6 is created by processing the columns of the matrix of FIG. 5 to obtain one or more rows having all entries of zero. By taking advantage of the entries of zero in the partial product matrix of FIG. 5, as well as the commutative property of addition, a row of the partial product matrix in FIG. 5 can be eliminated by moving zero entries all in one row, such as the first row of FIG. 6. Since the entries of each column of FIG. 5 will eventually be added together to obtain a final product digit, the order of entries in each column is inconsequential because of the commutative property of addition. Any non-zero entries in the column will be shifted to the lowest rows of the column. Any entries of zero in the column are shifted to the uppermost rows of the column. In columns that do not have entries for each row, any entries of zero are shifted to rows adjacent to and above the non-zero entries.

The columns may be processed in any order, but in this example, the columns will be processed from right to left. For column seven of the partial product matrix in FIG. 5, product P00 is shifted to the bottom and the three zeroes in the column are shifted to the top, as shown in FIG. 6. For column six of the matrix in FIG. 5, P01 and P10 are shifted to the bottom. The two zeroes are shifted in column six to the top of the column. For column five, P11 and P20 are shifted to the bottom, and the two zeroes are shifted to the top of the column. For column four P03 is shifted to the second row of the partial product matrix and the one zero is shifted up such that all non-zero entries in the column are now in the lowest rows of column. For column three, P13 is shifted to the third row, and the zero moved up such that all non-zero entries in the column are now in the lowest rows of column. For column two of the matrix, P23 is shifted to the lowest row, and the zero moved up just above P23. No changes to the first column are necessary, as P33 is already in the lowest row, as shown in FIGS. 5 and 6.

Another embodiment to process the partial product matrix of FIG. 5 would be to shift all column zero entries to the lower rows and all non-zero entries to the upper rows of partial product matrix shown in FIG. 6.

FIG. 6, thus, illustrates providing all entries of zero in the top row of the columns. Thus, only two adders are required to obtain the final product for the partial product matrix shown in FIG. 6. To add the three rows of numbers together with each adder having only two operands, as opposed to the three additions in FIG. 5, only two additions need to be made in FIG. 6: (0, P03, 0, 0, 0)+(0, P13, P21, P11, P01, 0)+(P33, P23, P31, P30, P20, P10, P00).

I. Adder Size Reduction for the Multiplier

FIG. 7 shows a second example initial partial product matrix, as well as the support and size of support for each line, or row, of the matrix. A support is a single non-zero partial product that is entered in a single matrix row. The size of support for a row is the number different supports provided in the row.

As described above with respect to FIG. 6, two adders will be needed to add the three rows of numbers in the partial product matrix of FIG. 7. The goal, then, of this step is to reduce the size of support for each row of the matrix in FIG. 7. With the size of support reduced, the number of inputs to each adder will be reduced, reducing the size of the multiplier.

In FIG. 7, in Line 1, or the first row of the partial product matrix, the only non-zero matrix row support entries that appear in the row one or more times are P0 and P1. Thus the support for Line 1 is the group of P0 and P1, as shown in the column labeled "Support" in FIG. 7. The "size" of support for the row is, thus, two because the number of row entries in the support for the row, or P0 and P1, is two. The size of support for Line1 is shown in the column labeled "Size of support" in FIG. 7. In Line 2, or the second row of the partial product matrix, the non-zero matrix row support entries are the group of P1, P2, P3 and P4. Thus, the "Support" for Line 2 is the group of P1, P2, P3 and P4, and the "Size of support" for Line 2 is four. In Line 3, the non-zero matrix row entries are P0, P2, P4, P5, P6 and P7. Thus the "Support" for Line3 is P0, P2, P4, P5, P6 and P7, and the "Size of Support" is also six.

FIG. 9 shows a partial product matrix resulting from shifting partial products in the columns of the partial product matrix of FIG. 7, again using the commutative property of addition, in order to minimize the number of adders required to implement a multiplier. Since the entries of each column of FIG. 7 will eventually be added together to obtain a final product digit, the order of entries in each column is inconsequential because of the commutative property of addition. Shifting is performed to minimize the "Size of Support" on any row. Using the three rows of the partial product matrix of FIG. 7, all possible transpositions are performed between entries in the same column of two adjacent lines in order to minimize, if possible, the size of support.

FIG. 8 illustrates transpositions of FIG. 7 matrix entries to obtain the matrix of FIG. 9. In column 3, P0 and P1 are transposed. In column four P3 and P0 are transposed. In column five, P0 and P1 are be transposed. In column six, P3 and P7 are transposed. In column seven, P4 and P2 are transposed. Although one transposition is illustrated, entries can be transposed two or more times to any matrix position in its column.

FIG. 9 shows the resulting partial product matrix after the transpositions shown in FIG. 8 are performed, as well as the resulting supports and size of supports. In Line 1 of FIG. 9, the first row of the partial product matrix, the only non-zero support is P1. Thus the "Support" for Line1 is the group of P1 only and the "Size of Support" for Line 1 is one. In Line 2, the support is the group of P0, P2, and P7, and the "Size of support" is three. In Line 3, the support is the group of P3, P4, P5 and P6, and the size of support for the row is four.

Comparing FIG. 7 and FIG. 9, the size of support has been reduced by one in the first two rows, and the size of support for the last row has been reduced by two. This reduction in the size of support for the rows in FIG. 9 will reduce the number of inputs to the adders and thus reduce the overall size of the adders.

I. Adder Tree Construction

FIG. 10 illustrates a third example partial product matrix, from which an adder tree will be constructed. According to the respective performances of LUTs and MUXCYs, large adders can be mapped onto MUXCYs and small adders will be smaller and faster and can be mapped onto look up tables.

To illustrate determining whether LUTs or MUXCYs can be used in an example below, a minimum size MUXCY to implement an adder is defined as size L, where L is the total number of inputs to an adder for two operands. As an example, let L is set equal to eight. Dynamic enumeration is used as described above to limit the number of resources required to implement a multiplier, or reduce the support size required, thus favoring the use of the smaller and faster LUTs if a larger MUXCY is not needed.

Using the partial product matrix shown in FIG. 10, assume the addition {{L1+L2}+{L3+L4}} is performed. Here, three adders are needed to perform the three additions, assuming two operands for each adder. The first addition, {L1+L2}, will have a support size of five because the non-zero numbers in the support for lines L1 and L2 are P1, P2, P3, P4 and P5.

Because the support size for {L1+L2} is five, which is less than L, with L=8 in this example, this addition will be implemented on LUTs. The second addition, {L3+L4}, will have a support size of ten because the non-zero numbers in the support for lines L3 and L4 are P6, P7, P8, P9, P10, P11, P12, P13, P14 and P15. Because the support size for {L3+L4} is ten, which is greater than L of 8 addition will be implemented using MUXCYs. The third and last addition, {{L1+L2}+{L3+L4}}, will have a support size of fifteen, which is greater than L of 8, so this last addition will also be implemented using MUXCYs. The addition of {{L1+L2}+{L3+L4}} thus uses two MUXCYs and one LUT adder.

In order to find a faster implementation of adders than that of the previous paragraph, a different combination of line pairs, or row pairs, in the partial product of matrix of FIG. 10 will now be analyzed. Assume the addition {{L1+L4}+{L2+L3}} is performed. Here, three adders are needs to perform the three additions, assuming two operands for each adder. The first addition, {L1+L4}, will have a support size of eight because the support for lines L1 and L4 are P1, P2, P10, P11, P12, P13, P14 and P15. With L=8, {L1+L4} will be implemented using LUTs. The second addition, {L2+L3}, will have a support size of seven with support for lines L2 and L3 being P3, P4, P5, P6, P7, P8 and P9. With L=8, and {L2+L3} being seven, this addition will also be implemented using LUTs. The third and last addition, {{L1+L4}+{L2+L3}}, will have a support size of fifteen, and will be implemented using MUXCYs. The addition of {{L1+L4}+{L2+L3}} thus uses only one MUXCYs and two faster LUT adders. Thus, the second implementation, {{L1+L4}+{L2+L3}}, which uses only one MUXCY and two LUTs is a faster implementation than the first implementation, {{L1+L}+{L3+L4}}, which uses two MUXCYs and one LUT.

In the example shown in FIG. 10, the analysis above could also be performed for {{L1+L3}+{L2+L4}} to determine whether an even faster implementation of adders can be achieved. Thus, another embodiment of this invention is to perform the analysis for all combinations of line pairs, or row pairs, in the partial product matrix to determine the fastest implementation of adders.

The multiplier generation according to embodiments of the present invention will improve the design performance of the final circuit, both in terms of operation speed and in terms of minimizing the use of PLD resources.

Although embodiments of the present invention has been described above with particularity, this was merely to teach one of ordinary skill in the art how to make and use the invention. For example, while an FPGA was described any integrated circuit having programmable logic and programmable interconnections may be used. Many additional modifications will fall within the scope of the invention, as that scope is defined by the following claims.

What is claimed is:

1. A method of optimizing resource allocation in an integrated circuit (IC) to minimize resources needed to create multipliers, the method comprising:

identifying a number of first parameters needed by each of the multipliers;

ranking the multipliers in order of the first parameters required to implement each of the multipliers;

pre-allocating to the multipliers in the ranking order a number of available first primitives in the IC for creating multipliers;

re-ranking the multipliers in topological order such that the ranks are reduced for multipliers with at least one constant input; and allocating the first multiplier primitives to the multipliers in the re-ranked order.

2. The method of claim 1, wherein the first parameters comprise the number of the primitives required to create the multipliers.

3. The method of claim 1, wherein the first parameters comprise at least one of:
   user-identified parameters;
   primitives required to implement each multiplier; and
   size of multiplier operands required by each multiplier.

4. The method of claim 1, wherein the first primitives comprise digital signal processing elements.

5. The method of claim 1, wherein the allocating further comprises assigning look up tables (LUTs) to the multipliers as second primitives once ones of the first primitives are exhausted.

6. The method of claim 1, wherein the allocating further comprises assigning multiplexer carries to the multipliers as second primitives once ones of the first primitives are exhausted.

7. The method of claim 1 wherein once the first primitives are exhausted, the allocating further comprises:
   determining the number of look up tables (LUTs) needed to implement each of the remaining multipliers;
   allocating a multiplexer carry as a second primitive to first ones of the multipliers where the number of LUTs needed to implement the first multipliers is greater than a predetermined number; and
   allocating LUTs as a third primitive to second ones of the multipliers apart from the first multipliers.

8. The method of claim 1, wherein the pre-allocating further comprises storing the results in a priority queue.

9. The method of claim 1, wherein the integrated circuit is a field programmable gate array.

10. A method of optimizing resource allocation in an integrated circuit (IC) to minimize resources needed to create multipliers, the method comprising:
   determining the number of look up tables (LUTs) needed to implement each of the multipliers;
   allocating a multiplexer carry as a first primitive to first ones of the multipliers where the number of LUTs needed to implement the multipliers is greater than a predetermined number; and
   allocating LUTs as second primitive to remaining ones of the multipliers apart from the first multipliers.

11. The method of claim 10, further comprising re-allocating the multiplexer carry and the LUTs to determine if a faster implementation can be achieved.

12. The method of claim 10, wherein the integrated circuit is a field programmable gate array.

13. A method of implementing a multiplier using first primitives and second primitives to implement the multiplier in an integrated circuit (IC), the method comprising:
   creating a partial product matrix from two inputs of the multiplier;
   shifting matrix column entries in the partial product matrix for the given multiplier so that ones of the entries with values of zero are shifted to top rows of the columns;
   transposing entries in adjacent ones of the rows within the same ones of the columns of the partial product matrix to place common entries on a same one of the rows of the matrix;
   determining a size of support needed for each of the rows of the partial product matrix using the shifted and transposed entries;
   constructing an adder tree from the rows of the partial product matrix to complete a multiplication operation for the multiplier;
   determining totals of the support sizes for stages of the adder tree; and
   allocating first primitives for one of the adder tree stages if the total size of supports for any two of the rows forming one of the adder tree stages is less than or equal to a given threshold and allocating second primitives if the total size of supports for one of the adder tree stages is greater than the given threshold.

14. The method of claim 13, wherein the shifting further comprises using the commutative property of the add operation to remove common rows from the columns of the partial product that have all entries with values of zero.

15. The method of claim 13, wherein the shifting further comprises obtaining as many of the rows as possible that have all zero value entries.

16. The method of claim 13, wherein a support is a group of non-zero matrix row entries that each appear in the row's entries one or more times.

17. The method of claim 16, wherein the size of support for a row is the number of non-zero matrix row entries in the group.

18. The method of claim 13, wherein the first primitives are look up table (LUT) adders, and the second primitives are multiplexer carry adders.

19. The method of claim 13, wherein the integrated circuit is a field programmable gate array.

* * * * *

UNITED STATES PATENT AND TRADEMARK OFFICE
CERTIFICATE OF CORRECTION

PATENT NO. : 7,627,458 B1  Page 1 of 1
APPLICATION NO. : 11/314767
DATED : December 1, 2009
INVENTOR(S) : Van Mau et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1014 days.

Signed and Sealed this

Second Day of November, 2010

David J. Kappos
*Director of the United States Patent and Trademark Office*